United States Patent [19]

Ashar et al.

[11] Patent Number: 5,448,497
[45] Date of Patent: Sep. 5, 1995

[54] EXPLOITING MULTI-CYCLE FALSE PATHS IN THE PERFORMANCE OPTIMIZATION OF SEQUENTIAL CIRCUITS

[75] Inventors: Pranav Ashar, Princeton; Sujit Dey, Plainsboro; Sharad Malik, Princeton, all of N.J.

[73] Assignee: NEC Research Institute, Inc., Princeton, N.J.

[21] Appl. No.: 941,658

[22] Filed: Sep. 8, 1992

[51] Int. Cl.⁶ ............................................. G06F 17/50
[52] U.S. Cl. .................................. 364/489; 364/488; 364/578
[58] Field of Search ............... 364/488, 489, 490, 491, 364/578; 371/23, 48

[56] References Cited

U.S. PATENT DOCUMENTS

| | | | |
|---|---|---|---|
| 4,263,651 | 4/1981 | Donath et al. | 364/300 |
| 4,970,664 | 11/1990 | Kaiser et al. | 364/521 |
| 5,191,541 | 3/1993 | Landman et al. | 364/489 |
| 5,278,769 | 1/1994 | Bair et al. | 364/490 |
| 5,365,528 | 11/1994 | Agrawal et al. | 371/25.1 |

OTHER PUBLICATIONS

Charles E. Leiserson, "Optimizing Synchronous Circuitry by Retiming" published in Advanced Research in VLSI: Proceedings of the Third Caltech Conference, pp. 23-36, Computer Science Press, 1983.

Sharad Malik, "Performance Optiming of Pipelined Circuits" published in Proceedings of the Int'l Conference on Computer-Aided Design, Nov. 1990 pp. 410-413.

Sharad Malik, "Retiming and Resynthesis: Optimizing Sequential Networks with Combinational Techniques", published in IEEE Transactions on Computer-Aided Design, vol. CAD-10 No. 1, pp. 74-84 Jan. 1991.

Primary Examiner—Kevin J. Teska
Assistant Examiner—Susan Wieland
Attorney, Agent, or Firm—Arthur J. Torsiglieri

[57] ABSTRACT

A methodology for the redesign of sequential VLSI circuits to increase the circuit speed involves cascading the circuit over a plurality of time frames without the memory elements, identifying any long false paths in the cascaded circuit, reconfiguring the original circuit to eliminate the false paths while providing fanout to preserve functionality, and retiming the reconfigured circuit to reduce circuit delay.

6 Claims, 5 Drawing Sheets

FLOWCHART FOR EXPLOITATION OF MULTI-CYCLE FALSE PATHS IN THE DELAY OPTIMIZATION OF SEQUENTIAL CIRCUITS

"X" marks the site of an untestable-fault

FLOWCHART FOR EXPLOITATION OF MULTI-CYCLE FALSE PATHS IN THE DELAY OPTIMIZATION OF SEQUENTIAL CIRCUITS

EXPLOITING MULTI-CYCLE FALSE PATHS IN THE PERFORMANCE OPTIMIZATION OF SEQUENTIAL CIRCUITS

INTRODUCTION

This invention relates to semiconductor integrated circuits and more particularly to the design of such circuits with the aid of computers.

BACKGROUND OF THE INVENTION

As integrated circuits have increased in complexity and as there has developed a need for integrated circuits customized to a particular application, computer-aided design (CAD) has become an important technology. Moreover, to achieve fast turn around time in the design phase, an important technique in CAD has been logic synthesis for the design of integrated circuits. In this technique, the digital circuit to perform a specific application is first synthesized in block schematic form as an assembly of functional elements, such as AND and OR gates, and memory elements, such as registers. Various computer programs are available for this process.

While this approach can provide fast turn around times and a circuit that is usually efficient in its use of surface area and that also lends itself readily to testing, the circuit is often not especially high in performance, typically because it usually includes unnecessarily long paths that serve to slow the speed of the circuit. The slower the speed of a circuit, the longer the clock period that needs to be used with the circuit, and the slower the rate at which the circuit can perform the processing. Generally, a technique for improving the performance of an integrated circuit synthesized in this manner is subsequently to modify the circuit specifically to shorten the paths thereof that introduce long delays.

The bulk of the work done in the area of performance optimization of digital circuits has focused on combinational logic circuits which are circuits, free of memory elements, such as registers, that make a circuit dependent on its prior history. Circuits that include such memory elements are generally described as sequential circuits. While recognizing the fact that these prior techniques vary significantly in terms of their approaches towards the problem of designing faster combinational logic circuits, we will collectively classify them as being combinational speedup or combinational resynthesis techniques to recognize the fact that they focus on combinational logic circuits. Combinational speedup techniques have been directly applied to sequential logic circuits by considering the combinational part between the memory elements; a speedup of the combinational part can directly translate into a reduction of the clock period. However, this approach does not exploit any information derived from the sequential behavior of the circuit. An alternative approach, termed retiming is described in the paper entitled "Optimizing Synchronous circuitry by Retiming", published in *Advanced Research in VLSI: Proceedings of the Third Caltech Conference*, pp. 23-36, Computer Science Press, 1983. This approach recognizes the sequential behavior of the circuit and attempts to minimize the clock period of the circuit by repositioning the memory elements. Combinational speedup and retiming can be viewed as two ends of the spectrum; combinational speedup works only on the combinational logic and ignores the memory elements, retiming focuses only on the memory elements and ignores the nature of the combinational logic. This naturally led to work that attempted to combine the two ends of this spectrum. In the approach termed retiming and resynthesis, as described in the paper entitled "Retiming and Resynthesis: Optimizing Sequential Networks With Combinational Techniques", published in *IEEE Transactions on Computer-Aided Design*, Vol. CAD-10 No. 1, pp. 74-84, January, 1991, it was shown how the two could be combined for a restricted class of sequential circuits. Subsequently, in a paper entitled "Performance Optimization of Pipelined Circuits", published in *Proceedings of the International Conference on Computer-Aided Design*, November, 1990, pp. 410-413, it was demonstrated how retiming and resynthesis could be optimally combined for the performance optimization of pipelined circuits. The most notable limitation of this approach was the restriction on the class of circuits that could be handled.

SUMMARY OF THE PRESENT INVENTION

The present invention relates to a design methodology, applicable more generally to sequential circuits, to improve the speed of the sequential circuit without changing its function. Basically, the methodology includes the following steps. Beginning with a circuit whose speed is to be improved, one first prepares for analysis a virtual circuit formed by cascading N copies of the original circuit over N time frames, where N is at least two. The memory elements are omitted in the virtual circuit. Next, one does a timing analysis (taking into account false paths) of the virtual circuit to identify the length L of the longest true path. Then one removes from the original circuit those paths that were longer than length L, making allowance for any fanouts along the long paths over the N time frames, to obtain a modified circuit that is fanout-free. This generally includes making multiple copies of the gates that are involved in fanouts, such that one copy lies in a path that is not false which can be retained, while the other copy lies in a false path that can be discarded. Then conventional techniques are used to remove any combinational or sequential redundancies from the modified circuit. Finally, the resulting redundancy-free circuit is retimed in conventional manner to reduce the delay and to obtain the desired faster circuit.

An important new element of this new methodology is cascading N copies (N being greater than one) of the original circuit and using such a cascaded circuit to analyze the timing properties of the original circuit. This element should have application in other methodologies involving sequential circuits. Usually, it will be desirable to eliminate the memory elements in the cascaded circuit, but this may not always be necessary. When the memory elements are not eliminated, the timing analysis tool would need to be modified appropriately.

The invention will be better understood from the following more detailed description taken with the accompanying drawing.

DETAILED DESCRIPTION OF THE INVENTION

It will be helpful to begin with discussion on false paths for an understanding of the principles of the invention. False paths in combinational logic circuits have been studied extensively, and for a full discussion, reference is made to a paper by S. Devadas, K. Keutzer, and S. Malik entitled "Delay Computation in Combinational Circuits: Theory and Algorithms", that appeared in *Proceedings of the International Conference on Computer-Aided Design*, November, 1991.

Figure 1:
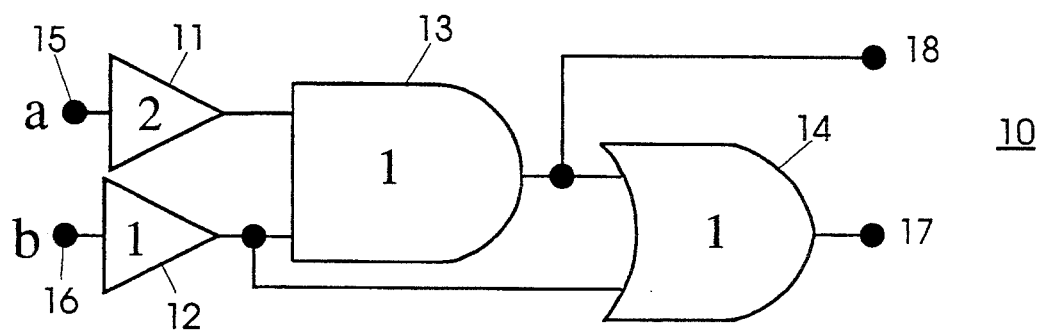
FIGS. 1-3 show circuits useful in a discussion of false paths and their removal. This discussion is helpful in explaining the present invention.

The circuit 10 in FIG. 1 will serve to illustrate the notion of false paths as well as their removal in combinational circuits. It includes a series of gates, including buffers 11 and 12, AND gate 13 and OR gate 14. The integers inside the gates in this circuit represent the assumed delays of the gates. We will consider the floating mode operation of the circuit. In this mode, the state of the circuit is considered to be unknown when a given input vector is applied. This is a pessimistic assumption; it does not underestimate the length of the longest true path. In addition, we allow for monotone speedup, i.e. the analysis remains valid even when one or more gates in the circuit speed up to switch faster than their specified delay values. In this context a path is false when for each possible value of a primary input vector v one of the following two things happens:

1. At the inputs to some gate along the path in question, the signal value on the path presents a non-controlling value while an off-path signal (also referred to as a side-input) presents a controlling value. A controlling value for a gate is a value that determines the output value for a gate independent of the other inputs to a gate, for example a 0 for an AND gate. A non-controlling value cannot determine the output value by itself, for example, a 1 for an AND gate. Thus, the off-path signal controls the output.
2. Both the on-path signal and the off-path signal appear to present controlling values, but the off-path signal presents the controlling value first (this is referred to as an early input), thereby determining the output of the gate. FIG. 1 illustrates both these conditions. Consider the path of length 4 from terminal 15, the input to buffer 11, to terminal 17, the output of OR 14, by way of gates 11, 13 and 14. Consider all possible assignments to a and b, the two inputs, at terminals 15 and 16, respectively.

a=0, b=0: The second condition listed above occurs at the AND gate 13.

a=0, b=1: The first condition listed above occurs at the OR gate 14.

a=1, b=0: The first condition listed above occurs at the AND gate 13.

a=1, b=1: The second condition listed above occurs at the OR gate 14.

Thus, this path is false. As used hereinafter and in the claims, a "false path" is a path that satisfies the two conditions set forth above.

Figure 2:
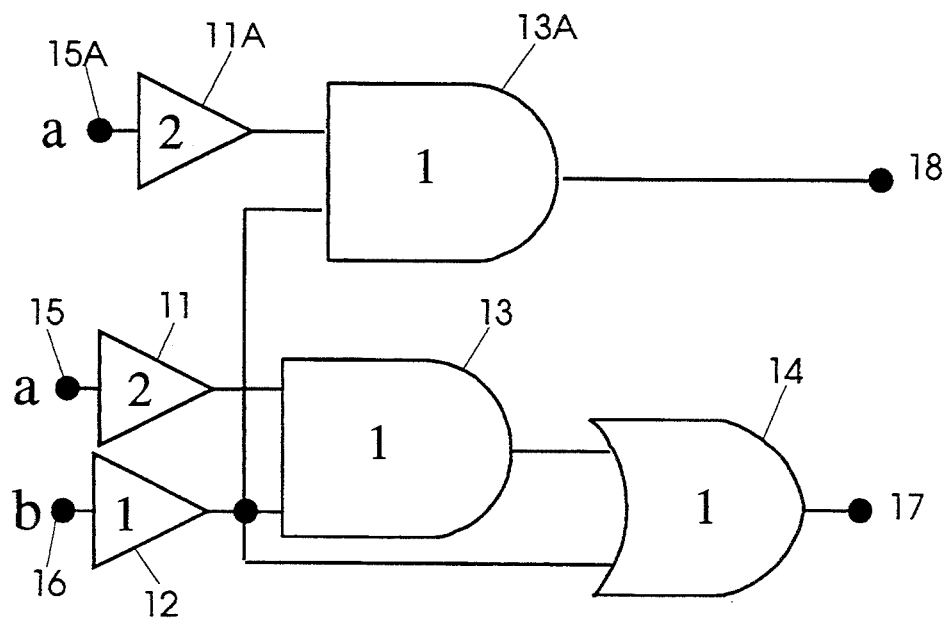
Figure 3:
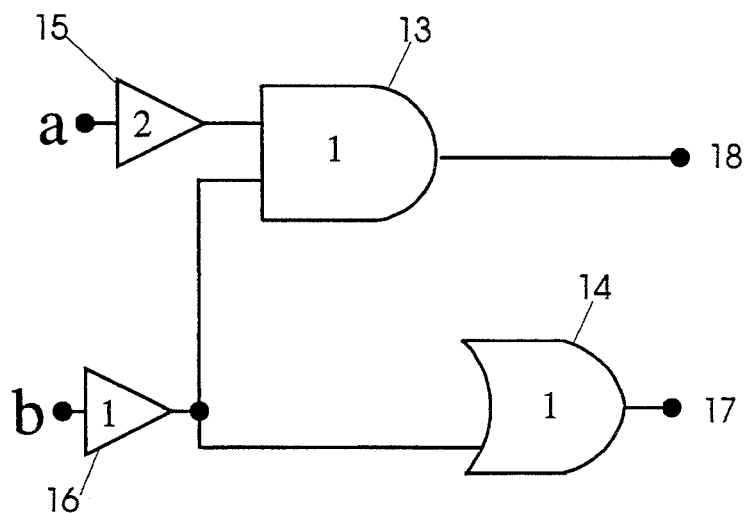

It is well known that if all paths of length at least $\delta$ are false in a circuit, then these paths can be removed from the circuit while preserving its logical functionality and guaranteeing that its true delay does not increase. This is accomplished by first making these paths fanout free; a path is said to be fanout free if each gate along the path has exactly one output connection. This process may involve the duplication of some gates in the circuit. This is illustrated in FIG. 2 where buffer 11A and AND gate 13A have been added as copies of gates 11 and 13. Next, the first connection along each of these paths may be set to either constant value 0 or 1. Removing the first connection of each of these paths effectively removes these paths from the circuit without changing its functionality. When the "a" input to the AND gate 13 on the path from terminals 15 to 17 is set to a 0, this permits the removal of the first connection 15 as well as the AND gate 13. The resulting circuit is shown in FIG. 3. Note that the removal of paths of length at least $\delta$ in the circuit (all of which were false), results in the longest path in the circuit to be of length less than $\delta$.

Figure 4:
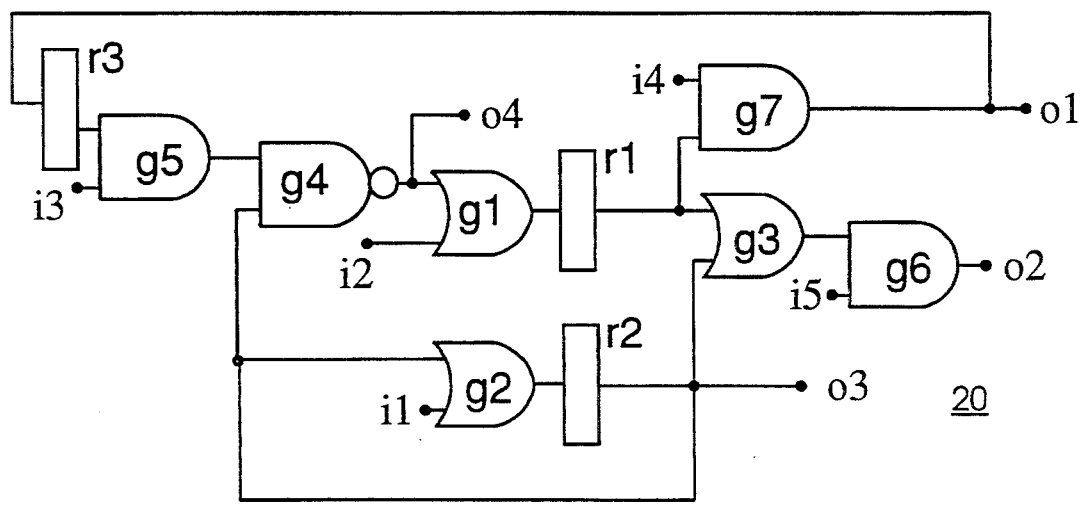
FIG. 4 is an example of a circuit that is to be modified to reduce its delay and so to increase its speed.

There now can be explained the principles of the invention and more particularly their applicability to the problem of increasing the speed of sequential circuits. FIG. 4 is an example of a sequential circuit 20 that is to be reconfigured to operate at a faster speed without change in functionality. The circuit 20 includes the AND gate $g_5$ of which one input is applied by input terminal $i_3$ and the other by way of register $r_3$. The output of AND gate $g_5$ is one input to the NAND gate $g_4$, the other input of which is from register $r_2$. The output of NAND gate $g_4$ supplies one input to OR gate $g_1$, the other input of which is from terminal $i_2$. The output of NAND gate $g_4$ is also connected to output terminal $o_4$. The output of OR gate $g_1$ is supplied to the input of the register $r_1$ the output of which is connected both as an input to AND gate $g_7$ and as an input to OR gate $g_3$. The output of AND gate $g_7$ is connected both as an input to register $r_1$ and as an output to terminal $o_1$. The terminal $o_3$ is also connected both to an input of OR gate $g_2$ and to an input of OR gate $g_3$. The output of OR gate $g_2$ is the input to register $r_2$ whose output is the other input to OR gate $g_3$. The output of OR gate $g_3$ is an input to AND gate $g_6$, the other input of which is supplied by terminal $i_5$. The output of AND gate $g_6$ is supplied to terminal $o_2$.

The initial (or starting) state of the circuit is $<r_1=0, r_2=0, r_3=0>$. For simplicity let the delay of each gate in this circuit be one time unit and let the propagation delay along a path be the sum of the gate delays encountered along the path. Since all the gates are two-input gates, this is a reasonable delay model. (Dependence of gate delay on its load can be handled and is an orthogonal issue.) Let all the primary inputs be available at the clock edge and let all the primary outputs be required only at the clock edge. Thus, the smallest feasible clock period for this circuit is 3, to allow for the delay through $g_5$, $g_4$, and $g_1$. This circuit has the following properties:

It has no sequential redundancies; hence no connection/gate can be removed without changing its functionality.

Retiming cannot reduce the clock period to below 3.

There are no false paths in the combinational part of the circuit. This includes consideration of unreachable states of the circuit. The state $<r_1=0, r_2=0, r_3=1>$ is an unreachable state, i.e. there is no sequence of inputs that can drive the machine to this state. It may be possible that for a given path in the circuit to be true, it is required that the machine be in an unreachable state. Since that will never be possible, this path will never be exercised. Thus, unreachable states must be taken into account while determining the truth or falsity of paths. In this example, there is no path that needs the unreachable state in order to be exercised. Thus, for each path in the circuit, starting from the initial state, there exists some sequence of input vectors that will exercise the path.

Our goal is to reduce the clock period needed for this circuit to 2.

Figure 5:
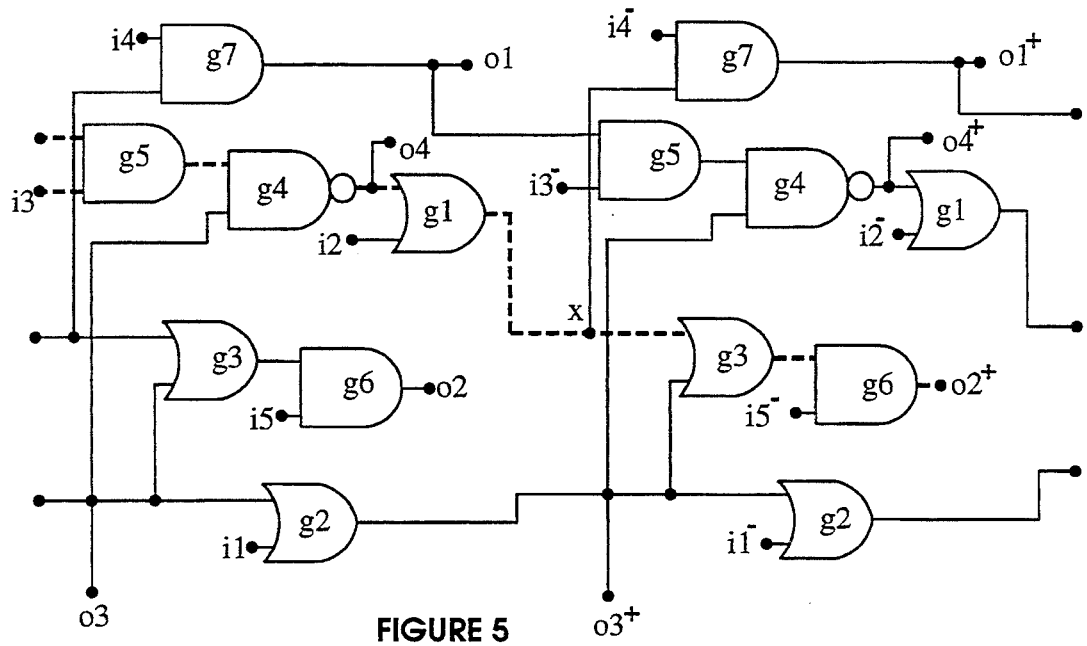
FIG 5 shows the combinational parts of the circuit of FIG. 4 cascaded for two-cycle behavior.

Consider the operation of the circuit over two clock periods (or cycles). Conceptually, this can be visualized by considering two copies of the combinational part of this circuit cascaded, with the registers removed, as shown in FIG. 5. In this circuit, the same reference characters have been used for the corresponding gates in the two versions cascaded with either a plus or minus sign added to the new terminals, as described in the retiming and resynthesis paper. This is similar to the notion of considering multiple time frames in the test generation for sequential logic circuits.

Consider the two broken line paths beginning at the two inputs of AND circuit $g_5$ on the left copy of the circuit and passing through NAND gate $g_4$, OR gate $g_1$, OR gate $g_3$ in the right hand copy of the circuit, and AND gate $g_6$ to output $o_2^+$.

These paths are two-cycle paths, i.e. they span two cycles of operation for the circuit. Also, these are the only two-cycle paths of length 5, if we assume as before a delay of one unit per gate. What is interesting about these paths is that they are false. To see why this is so, observe that for any of these paths to be true $o_3$ must present a 1 at the input of NAND gate $g_4$ along the path since it is an early side input. However, if this happens, the output of $g_2$ is also a 1 and this is presented to $g_3$ in the second time frame. For any of these paths to be true, the connection from $g_2$ to $g_3$ in the second time frame must present a 0 since it is an early side input. Thus, both the paths in question are false. Note that the single cycle segments of both these paths are true. The three single-cycle paths: (1) from the output of register r to x the output of OR $g_1$, (2) from input $i_3$ to z, and (3) from x to $o_2^+$ are each individually true.

Since the two paths are false, they can be removed without changing the functional behavior of the circuit as viewed over two cycles. However, before their removal, these paths must be made fanout free.

Actually, the major steps of the procedure, viz. identifying and removing two-cycle false paths, followed by a retiming can be directly done on the original circuit itself. The two-cycle behavior is only needed to conceptually understand what is going on. It should be noted that this technique can be extended to any number of cycles (or time frames).

We know from the foregoing that both of the longest two-cycle paths (of length 5), $r_3$, $g_5$, $g_4$, $g_1$, $r_1$, $g_3$, $g_6$, $o_2$ and $i_3$, $g_5$, $g_4$, $g_1$, $r_1$, $g_3$, $g_6$, $o_2$ are false in the circuit of FIG. 4. As explained before, they are false because to sensitize these paths, a 1 is required on the output of register $r_2$ in the first clock cycle, and a 0 in the second clock cycle. This is not possible because of the OF gate $g_2$.

Figure 6:
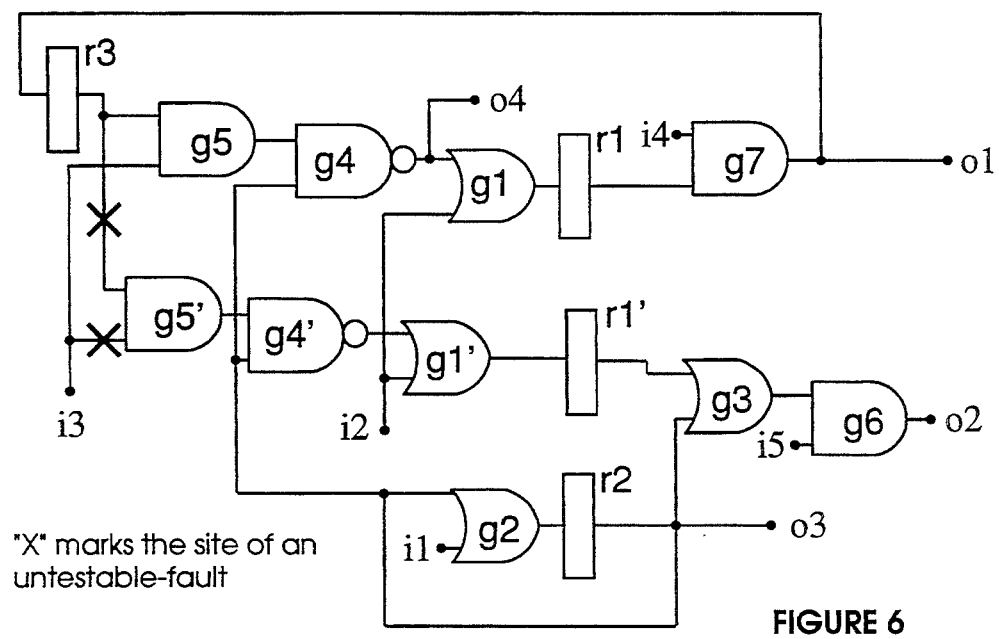
FIG. 6 is the circuit of FIG. 5 after the two-cycle false paths have been removed and fanout compensation added for the two-cycle false paths removed.
Figure 7:
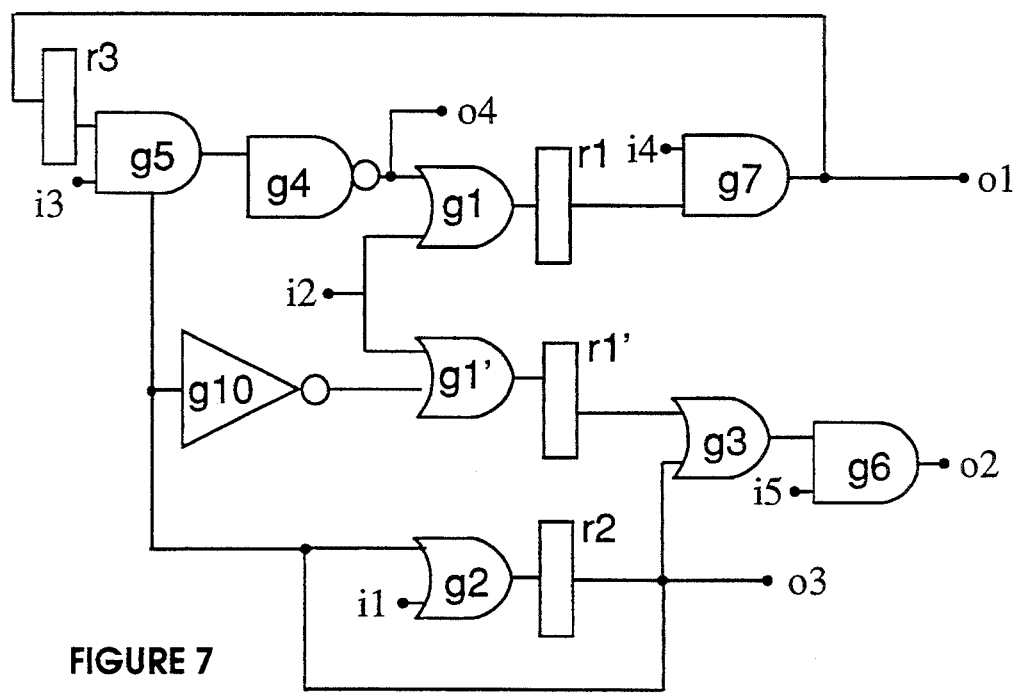
FIG. 7 shows the circuit of FIG. 6 after the first connections of these paths have been set to a constant value.

Given the knowledge that all the two-cycle paths of length 5 are false, we generate the circuit of FIG. 7 in which both two-cycle paths of length 5 are fanout free. This circuit was obtained in the following manner from the initial circuit shown in FIG. 4: We began from the final terminal in the longest paths, namely $o_2$, and proceeded towards the circuit inputs along the longest paths. The first point at which a fanout is encountered is the output of register $r_1$. The fanout of $r_1$ to $g_3$ lies on the two-cycle paths of length 5, and the fanout of $r_1$ to $g_7$ does not. Since the goal is to make the two-cycle paths of length 5 fanout free, we duplicate $r_1$ into $r_1$ and $r'_1$. The initial state of $r'_1$ is the same as the initial state of $r_1$, i.e. 0. The gate $g_1$ now fans out to $r_1$ and $r'_1$. The same step is repeated on the gates $g_1$, $g_4$ and $g_5$ in that order to finally obtain the circuit in FIG. 6.

In the circuit of FIG. 6, the two-cycle paths of length 5, i.e. $r_3$, $g'_5$, $g'_4$, $g'_1$, $r'_1$, $g_3$, $g_6$, $o_2$ and $i_3$, $g'_5$, $g'_4$, $g'_1$, $r'_1$, $g_3$, $g_6$, $o_2$, are not only false, they are also fanout free. As a result both stuck-at-0 and stuck-at-1 faults on the fanout of $r_3$ to $g'_5$ are sequentially redundant because their effect cannot be propagated beyond two time frames. Similarly, the stuck-at faults on the fanout of $i_3$ to $g'_5$ are also sequentially redundant (independent of the faults on the fanout of $r_3$ to $g'_5$). Therefore, we can replace each of the two wires by constant values. We choose to replace both the wires by the constant 1. Propagating the constant values provides the circuit of FIG. 7. This result is a more general form of the observation made in a prior art paper that a stuck-at fault on the first link of a fanout-free combinational false path is combinationally redundant.

In particular, if in the circuit of FIG. 6 the inputs provided at inputs from $i_3$ and $r_3$ are fixed at 1, it is assured that the output of AND gate $g'_5$ is 1. In turn, this permits the output of NAND gate $g'_4$ to be dependent only on the input from register $r_2$. As a consequence, the gates $g'_5$ and $g'_4$ are eliminated and there is added the inverter gate $g_{10}$ whose input is supplied by register $r_2$ and whose output provides an input to OR gate $g'_1$, as shown in FIG. 7.

Figure 8:
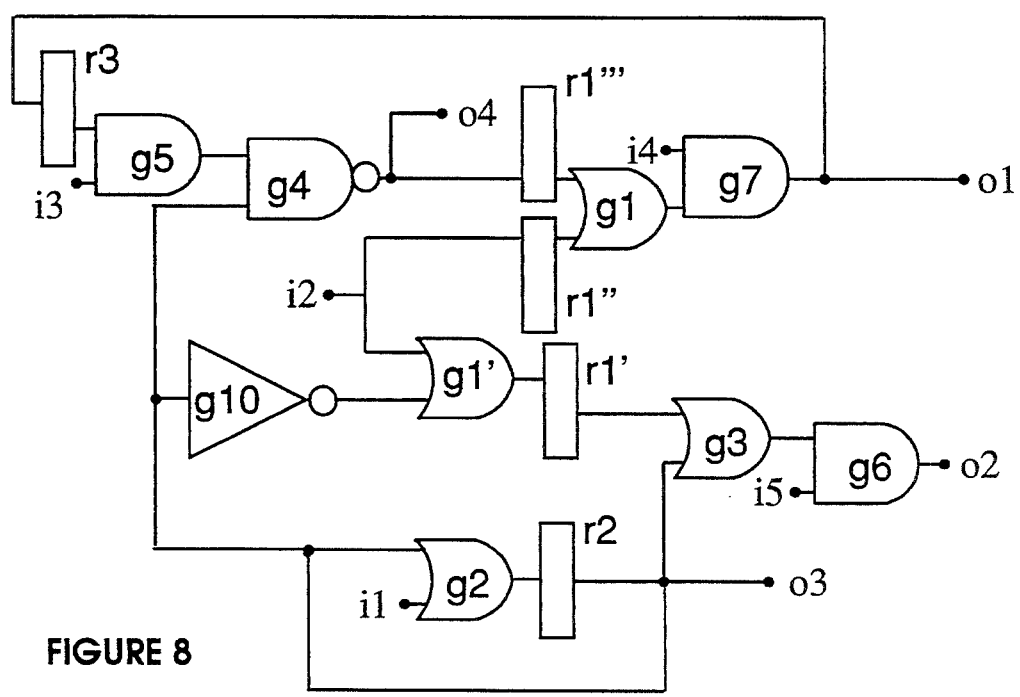
FIG. 8 shows the circuit of FIG. 7 after final retiming to shorten its delay.

Notice that the longest two-cycle path in this circuit is of length 4, and is true. The clock-period of this circuit is still 3, but is reduced to 2 by retiming, as shown in FIG. 8. Retiming is done in the manner described in the earlier mentioned paper published in *Advanced Research in VLSI: Proceedings of the Third Caltech Conference*, pp. 23–36, Computer Science Press, 1983. As seen in FIG. 8, in the retimed circuit, register $r_1$ has been replaced from the output path of OR $g_1$ and register $r_1'''$ has been included in an input lead of OR gate $g_1$ and a new register $r_1''$ has been added to the other input lead of OR $g_1$.

The initial state of the retimed circuit is $<r_3=0, r_2=0r', _1=0, r''_1=0, r'''_1=0>$. Notice two things:

All the circuits in FIGS. 4–8 are functionally identical.

The circuit of FIG. 8 has 9 gates and 5 registers, while the original circuit (FIG. 4) has 7 gates and 3 registers.

As mentioned previously, it should be noted that this technique can be extended to false paths over any number of cycles, when required.

The details of this multi-cycle false path utilization algorithm that operates on a single copy of the circuit will now be discussed.

The delay optimization algorithm operates on a single copy of the circuit. The algorithm is general in the sense that it can utilize false paths over an arbitrary number of time frames to reduce the clock-period. The basic outline of the overall algorithm is given below in C-like syntax familiar to workers in logic synthesis:

```
reduce-clock-period(ckt, num_tf)
{
    /* ckt satisfies the property that it has no false paths over
    num_tf − 1 time frames */
    casc_ckt = make-cascade(ckt, num_tf);
    δ = timing-analysis(casc_ckt);
    ckt = remove-multi-cycle-false-paths(ckt, num_tf, δ);
    ckt = remove-combinational-redundancies(ckt);
    ckt = remove-sequential-redundancies(ckt);
    ckt = retime-for-delay(ckt);
    return (ckt);
}
```

Figure 9:
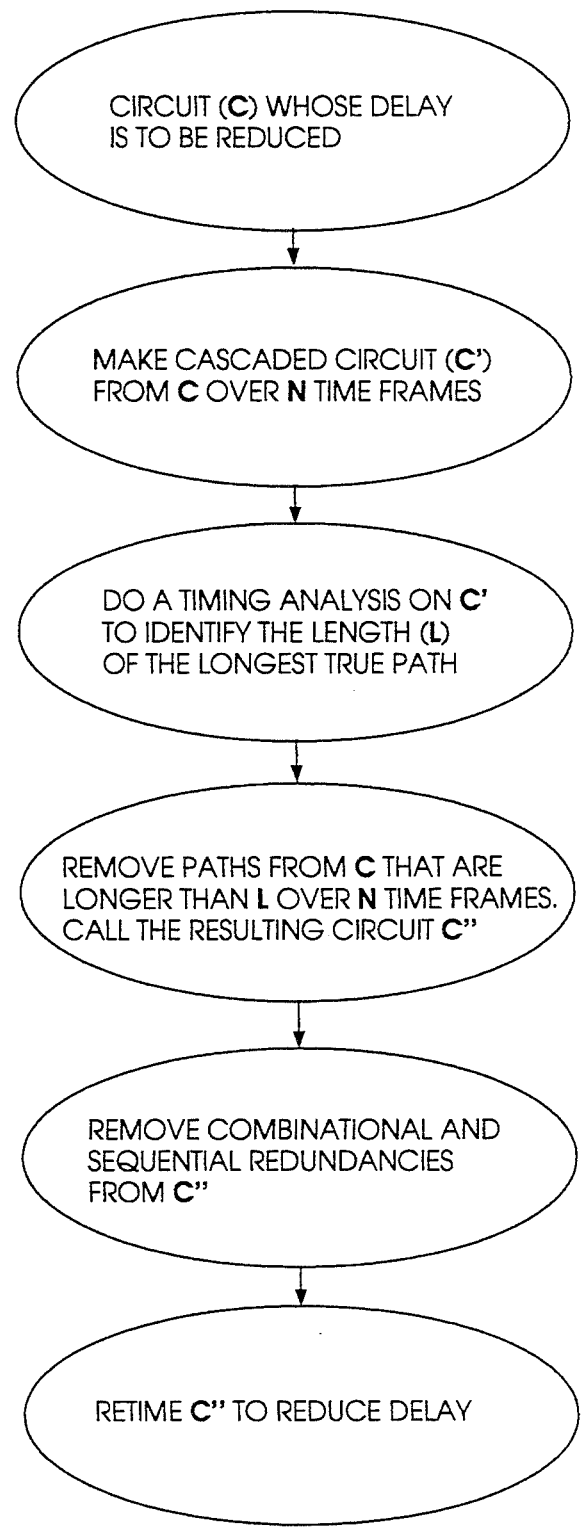
FIG. 9 is a flowchart of the basic process of the invention.

The corresponding flowchart is shown in high level form in FIG. 9.

As indicated in block 90, there is first prepared the sequential circuit C whose delay is to be reduced by eliminating the unnecessary longest paths that serve as the limiting factor in the length of clock cycle that can be used. In the example described this corresponds to FIG. 4.

Next, as indicated by block 91, the circuit C in its combinational form is cascaded over at least two cycles and the resulting circuit C' is subjected to a timing analysis to identify the length L of the longest true path in known fashion, as pointed out previously. Then as indicated in FIG. 6, the circuit C is reconfigured to provide any fanout needed in any false paths longer than L and then such false paths are removed from the reconfigured circuit to obtain a circuit C'' as indicated by block 93. Then as indicated by block 94, any combinational or sequential redundancies are removed (in the example there were no such redundancies) and finally, as indicated in block 95, the circuit is retimed in conventional fashion to provide the final circuit shown in FIG. 8.

In practice, the relative order of the retiming step and the step of removing combinational or sequential redundancies is not critical and either may be performed first.

A more technical description of the algorithm might be as follows. The input to the algorithm is the sequential circuit (ckt) to be optimized for delay and the number of time frames (num_t f) over which the multi-cycle false paths have to be identified and removed. In the first step, a combinational circuit (casc_ckt) is generated by unfolding ckt num_tf times. There are no registers on the wires that connect successive time frames. In this combinational circuit, there is no logical correlation between the values at any pair of primary inputs, and all primary outputs are distinct from each other. The timing analysis algorithm that determines δ, the length of the longest true path, will work on this circuit. The timing analysis algorithm determines δ by iteratively checking if a given value of δ is correct. This transformation is shown in FIG. 5. For purposes of the timing analysis algorithm, the arrival times on the primary inputs are fixed as follows: Let $a_i$ be the arrival time at primary input i. Let $i_n$ be a primary input i in the $n^{th}$ time frame, let δ be the value of the longest path being checked for correctness, the arrival time at $i_n$, $a_i$, is set to $(a_{i1}+δ×(n−1)/num\_tf)$. Note that casc_ckt is generated only for the purposes of timing analysis. In the second step of the algorithm, timing analysis is performed on casc_ckt to compute δ, the length of the longest true path in casc_ckt. Once the timing analysis has been carried out, casc_ckt is discarded.

In the next step, the multi-cycle false path removal algorithm is invoked. The algorithm operates on a single copy of the circuit, and is novel in that it only duplicates that part of the sequential circuit necessary to make the long multi-cycle false paths fanout free. Once the long false paths have been made fanout free, the first connection of each fanout-free long false path is set to a constant (either of 0 or 1), and the constant is propagated as far as possible. This algorithm is based on the algorithm for false-path removal in combinational circuits described a paper presented at the *ACM/SIGDA Workshop on Timing Issues in the Specification and Synthesis of Digital Systems*, March 1992, entitled "Circuit structure relations to redundancy and delay: The KMS Algorithm Revisited". An outline of remove-multi-cycle-false-paths() is presented in the pseudo-code below:

```
remove-multi-cycle-false-paths(ckt, num_tf, δ)
{
    /* In each time frame tf, for each gate g, compute the set of all path lengths a_g^{tf}
    starting from the first time frame to the output of g in the time frame tf. */
    gate_list = list of all gates ordered from circuit inputs to circuit outputs;
    for (tf = 1; tf <= num_tf; tf ++) {
        foreach_gate g in gate_list {
            if (g is a primary input) { a_g^{tf} = arrival time at input g in time frame tf;

} else if (g is a latch && tf != 1) {
                fanin = gate feeding the latch g;

a_g^{tf} = a_{fanin}^{tf-1};

} else if (g is a latch && tf == 1) { a_g^{tf} = {0};

} else { a_g^{tf} = { };

foreach_fanin fanin of gate g {

/* d_i^j is the delay from the output of gate i to the output of gate j */
```

-continued

```
        a_g^{tf} = a_g^{tf} ∪ {t + d_{fanin}^g | t  a_{fanin}^{tf}};
      }
    }
  }
  for (tf = num_tf; tf >= 1; tf --) {
    gate_list = list of all gates ordered from circuit outputs to circuit inputs;
    /* In the time frame tf, for each gate g, compute the set of all path lengths e_g^{tf}
       from the output of g in the time frame tf to the circuit outputs in the num_tf^{th} time fram
    foreach_gate g in gate_list { e_g^{tf} = { };

foreach_fanout fanout of gate g {
        if (fanout is a primary output) { e_g^{tf} = e_g^{tf} ∪ {0};

} else if (fanout is a latch && tf == num_tf) { e_g^{tf} = e_g^{tf} ∪ {0};

} else if (fanout is a latch && tf != num_tf) { e_g^{tf} = e_g^{tf} ∪ e_{fanout}^{tf+1};

} else { e_g^{tf} = e_g^{tf} ∪ {t + d_g^{fanout} | t  e_{fanout}^{tf}};
        }
      }
    }
    /* Now, duplicate gates so that the parts of the paths longer than δ that are traversed
       during the tf^{th} clock tick will not have any fanout */
    foreach_gate g in gate_list { foreach_time t in ascending order in a_g^{tf} { if (t + min(e_g^{tf}) ≤ δ && t + max(e_g^{tf}) > δ) {

/* Gate g must by duplicated. If g is a latch, the latch is duplicated */
          g' = duplicate_gate(g);

a_{g'}^{tf} = a_g^{tf};

e_{g'}^{tf} = e_g^{tf} - {t_e | t_e   e_g^{tf}, t + t_e ≤ δ};

e_g^{tf} = e_g^{tf} - {t_e | t_e   e_g^{tf}, t + t_e > δ};

/* Now distribute the fanout */ ;
          foreach_fanout fanout of gate g { if (fanout is a latch && t + min(e_{fanout}^{tf+1}) > δ) { replace connection from g to fanout by g' to fanout;

} else if (t + min(e_{fanout}^{tf}) + d_g^{fanout} > δ) { replace connection from g to fanout by g' to fanout;
            }
          }
        }
      }
    }
  }
  Set constants on the first edge of all paths longer than δ in num_tf time frames;
  Propagate constants as far as possible;
  /* A constant is propagated through a latch only if it is the same as the initial value of the latch
  return(ckt);
}
```

Once the long multi-cycle false paths have been removed, combinational and sequential redundancies are removed from the circuit to recover area. The circuit is then retimed to reduce the clock period.

The procedure described can be shown not to alter the functionality of the circuit.

It is to be understood that the specific example described is merely illustrative of the general principles of the invention and that typically the circuit that needs to be configured is more complex than that described.

What is claimed is:

1. The process for redesigning a sequential circuit that includes memory elements to reduce its delay without affecting its operating function comprising the steps of preparing from a design of the sequential circuit a design in which the sequential circuit is cascaded over a plurality of time frames to provide a cascaded circuit design with the memory elements of the circuit absent, doing a timing analysis of the cascaded circuit design to identify the length L in time of the longest true path in the cascaded circuit, and therefrom to identify any false paths of length in time longer than L, reconfiguring the initial sequential circuit design to remove paths that are longer than L in time over the plurality of time frames without affecting the functionality of the circuit, removing any combinational or sequential redundancies from the reconfigured sequential circuit design, and retiming the resulting circuit design by repositioning memory elements of the circuit for reducing any unnecessary delay, thereby providing the desired circuit design with reduced delay.

2. The process for claim 1 in which the step of reconfiguring the initial sequential circuit includes providing for gates involving fanout that are included in said false paths of length longer than L an alternate path independent of false paths to preserve the functionality of the circuit.

3. The process of claim 1 in which the sequential circuit to be redesigned is free of any multi-cycle combinational paths.

4. The process for redesigning a sequential circuit that includes memory elements to reduce its delay without affecting its operating function comprising the steps of preparing from a design of the sequential circuit a design in which the sequential circuit is cascaded over a plurality of time frames to provide a cascaded circuit design with the memory elements of the circuit absent, doing a timing analysis of the cascaded circuit design to identify the length L in time of the longest true path in the cascaded circuit, and therefrom to identify any false paths of length in time longer than L, reconfiguring the inital sequential circuit design to remove paths that are longer than L in time over the plurality of time frames without affecting the functionality of the circuit, retiming the resulting circuit design for reducing any unnecessary delay in its design, thereby providing the desired circuit with reduced delay, and removing any combinational or sequential redundancies from the reconfigured sequential circuit design.

5. The process of claim 4 in which the sequential circuit to be redesigned is free of any multi-cycle combinational paths.

6. The process for claim 4 in which the step of reconfiguring the initial sequential circuit includes providing for gates involving fanout that are included in said false paths of length longer than L an alternate path independent of false paths to preserve the functionality of the circuit.

* * * * *